US008466497B2

(12) United States Patent
Usami

(10) Patent No.: US 8,466,497 B2
(45) Date of Patent: Jun. 18, 2013

(54) SEMICONDUCTOR INTEGRATED CIRCUIT CHIP AND LAYOUT METHOD FOR THE SAME

(75) Inventor: Shiro Usami, Osaka (JP)

(73) Assignee: Panasonic Corporation, Osaka (JP)

( * ) Notice: Subject to any disclaimer, the term of this patent is extended or adjusted under 35 U.S.C. 154(b) by 17 days.

(21) Appl. No.: 13/270,651

(22) Filed: Oct. 11, 2011

(65) Prior Publication Data

US 2012/0025272 A1 Feb. 2, 2012

Related U.S. Application Data

(63) Continuation of application No. PCT/JP2009/005706, filed on Oct. 28, 2009.

(30) Foreign Application Priority Data

Apr. 27, 2009 (JP) .................... 2009-108220

(51) Int. Cl.
*H01L 27/10* (2006.01)
(52) U.S. Cl.
USPC ........... 257/203; 257/210; 257/691; 257/778; 257/E27.07; 716/55
(58) Field of Classification Search
USPC .................. 257/203, E27.07, 210, 691, 778, 257/786; 716/55, 9, 11
See application file for complete search history.

(56) References Cited

U.S. PATENT DOCUMENTS

| 5,952,726 A * | 9/1999 | Liang ........................ 257/778 |
| 2002/0113319 A1 | 8/2002 | Ohno |
| 2006/0236175 A1 | 10/2006 | Usami et al. |

FOREIGN PATENT DOCUMENTS

| JP | 62-179744 | 8/1987 |
| JP | 2002-190526 | 7/2002 |
| JP | 2005-142281 | 6/2005 |
| JP | 2006-294651 | 10/2006 |

* cited by examiner

Primary Examiner — Thinh T Nguyen
(74) Attorney, Agent, or Firm — McDermott Will & Emery LLP

(57) ABSTRACT

A semiconductor integrated circuit chip mounted on a substrate by flip chip bonding includes: a plurality of electrode pads; a corner portion of a flat periphery of an inner layer; a first linear region adjoining one side of the corner portion; a second linear region adjoining another side of the corner portion; and a third linear region adjoining a side of the first linear region opposite to the side adjoining the corner portion. A circuit core placeable region is provided in at least part of the corner portion and the first linear region. A plurality of IO cells connected to the electrode pads are arranged in the second and third linear regions. The IO cells in the second linear region are connected to the electrode pads arranged inwardly in n rows×n columns from a corner of the chip above the corner portion.

14 Claims, 15 Drawing Sheets

US 8,466,497 B2

SEMICONDUCTOR INTEGRATED CIRCUIT CHIP AND LAYOUT METHOD FOR THE SAME

CROSS-REFERENCE TO RELATED APPLICATION

This is a continuation of PCT International Application PCT/JP2009/005706 filed on Oct. 28, 2009, which claims priority to Japanese Patent Application No. 2009-108220 filed on Apr. 27, 2009. The disclosures of these applications including the specifications, the drawings, and the claims are hereby incorporated by reference in their entirety.

BACKGROUND

The present disclosure relates to a semiconductor integrated circuit chip mounted on a substrate by flip chip bonding.

In recent years, as the semiconductor fabrication process has been increasingly miniaturized, it has become possible to mount a large-scale circuit on a semiconductor integrated circuit chip. With this achievement, full-scale development of a system LSI, in which a set of functions conventionally constituted by a plurality of semiconductor integrated circuit chips is integrated into one semiconductor integrated circuit chip, has started. Meanwhile, while the area of a semiconductor integrated circuit chip is increasingly decreasing, the number of terminals on a semiconductor integrated circuit chip tends to be larger as a larger number of functions are integrated on one semiconductor integrated circuit chip. Therefore, to secure a necessary number of terminals, some contrivance is made where electrode pads are arranged on the entire surface of a the semiconductor integrated circuit chip, or arranged in a staggered shape on a flat periphery of the semiconductor integrated circuit chip, to allow the semiconductor integrated circuit chip to be mounted on a substrate by flip chip bonding. Also, the density of arrangement of the electrode pads is increased by devising the layout of IO cells connected to the electrode pads (see Japanese Patent Publication No. 2005-142281, for example).

FIG. 15 shows a layout of a conventional semiconductor integrated circuit chip. In connection of IO cells 11 to electrode pads 10 arranged inwardly in n rows from the outer edge of the surface of the semiconductor integrated circuit chip 100 (n=5 in FIG. 15), the IO cells 11 can be arranged efficiently in linear regions of a flat periphery of the semiconductor integrated circuit chip when the width of the IO cells 11 is m/n (m is the pitch of arrangement of the electrode pads 10).

SUMMARY

In a corner portion of the conventional semiconductor integrated circuit chip 100, while there is space available for arrangement of n×n×2 IO cells 11, the number of electrode pads 10 present to be actually connected to the IO cells 11 is only n×n, a half of the number of IO cells 11. Therefore, in the corner portion of the semiconductor integrated circuit chip 100, the arrangement of the IO cells 11 is sparse, resulting in formation of a number of IO cell-free regions 12 where no IO cell is arranged. Thus, a region equivalent to n×n IO cells 11 may become dead space. In particular, when n is 3 or more, a number of narrow IO cell-free regions 12 are formed, resulting in formation of dead space over a fairly wide region.

In view of the above problem, it is an objective of the present disclosure to provide a semiconductor integrated circuit chip mounted on a substrate by flip chip bonding, in which vacant space with no IO cell arranged therein can be used effectively.

To attain the above objective, the semiconductor integrated circuit chip of the present disclosure is a semiconductor integrated circuit chip mounted on a substrate by flip chip bonding, including: a plurality of electrode pads arranged on a surface of the chip; a corner portion of a flat periphery of an inner layer of the chip; a first linear region adjoining one side of the corner portion; a second linear region adjoining another side of the corner portion; and a third linear region adjoining a side of the first linear region opposite to the side adjoining the corner portion, wherein a circuit core placeable region is provided in at least part of the corner portion and the first linear region, a plurality of IO cells respectively connected to the plurality of electrode pads are arranged in the second linear region and the third linear region, and the plurality of IO cells in the second linear region are respectively connected to the plurality of electrode pads arranged inwardly in n rows×n columns (n is an integer equal to or more than 3) from a corner of the chip located above the corner portion.

Alternatively, the semiconductor integrated circuit chip of the present disclosure is a semiconductor integrated circuit chip mounted on a substrate by flip chip bonding, including: a plurality of electrode pads arranged on a surface of the chip; a corner portion of a flat periphery of an inner layer of the chip; a first linear region adjoining one side of the corner portion; a second linear region adjoining another side of the corner portion; a third linear region adjoining a side of the first linear region opposite to the side adjoining the corner portion; and a fourth linear region adjoining a side of the second linear region opposite to the side adjoining the corner portion, wherein a circuit core placeable region is provided in at least part of the corner portion, the first linear region, and the second linear region, a plurality of IO cells respectively connected to the plurality of electrode pads are arranged in the third linear region and the fourth linear region, the plurality of IO cells are respectively connected to the plurality of electrode pads arranged inwardly in n rows×n columns (n is an integer equal to or more than 3) from a corner of the chip located above the corner portion, and at least one electrode pad out of the plurality of electrode pads in n rows×n columns is connected directly to a circuit core placed in the circuit core placeable region.

With the above configuration, a comparatively wide circuit core placeable region is secured on the corner portion of the flat periphery of the inner layer of the semiconductor integrated circuit chip. Such a region can be used effectively by placing a circuit core in this region, for example.

According to another aspect of the present disclosure, the layout method for a semiconductor integrated circuit chip mounted on a substrate by flip chip bonding includes the step of arranging basic patterns, each including n (n is an integer equal to or more than 3) electrode pads arranged inwardly from an outer edge of a surface of the chip, n IO cells arranged on a flat periphery of an inner layer of the chip, and interconnects for connecting the electrode pads and the IO cells, side by side along one side of the chip up to the end of the side, and arranging the basic patterns changed in orientation side by side along a side adjoining the one side.

According to the above method, by only arranging the basic patterns side by side with no special consideration on the connection layout between the electrode pads and the IO cells on a corner portion of the semiconductor integrated circuit chip, a sufficiently wide circuit core placeable region can be secured on the corner portion of the semiconductor integrated circuit chip.

According to the present disclosure, in the semiconductor integrated circuit chip mounted on a substrate by flip chip bonding, a vacant region with no IO cell placed can be used effectively as a circuit core placeable region in which a memory circuit, an electric fuse, an analog circuit, etc. can be placed.

DETAILED DESCRIPTION

Embodiments of the present disclosure will be described hereinafter with reference to the accompanying drawings.

First Embodiment

Figure 1:
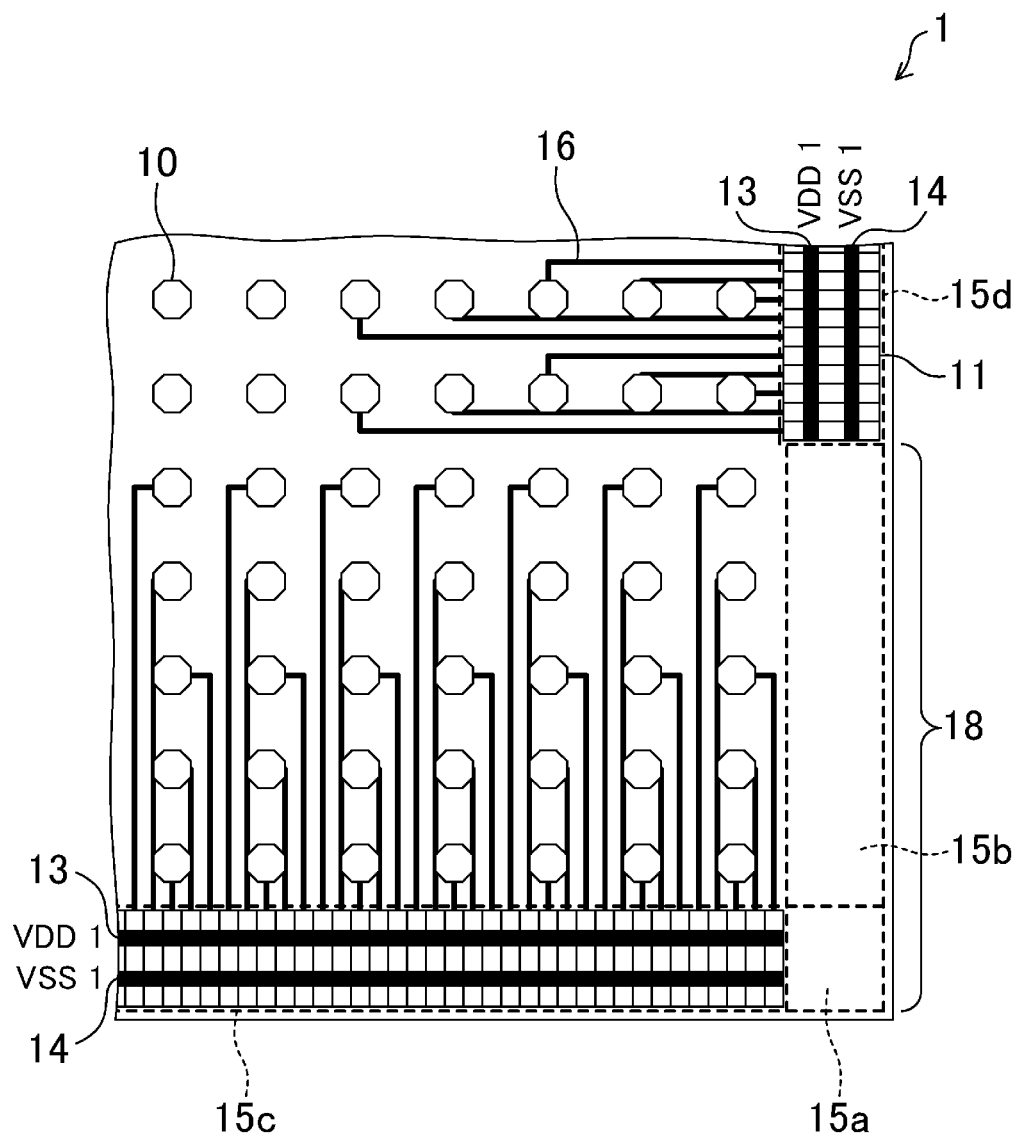
FIG. 1 is a layout plan of a semiconductor integrated circuit chip of the first embodiment.

FIG. 1 shows a layout of a semiconductor integrated circuit chip of the first embodiment, which illustrates the surface layer and a plurality of inner layers stacked one upon another as viewed from top. A plurality of electrode pads 10 are arranged in a grid shape over a given expanse of the surface of a semiconductor integrated circuit chip 1, and the semiconductor integrated circuit chip 1 is mounted on a substrate by flip chip bonding. A plurality of IO cells 11 are arranged on a flat periphery of an inner layer of the semiconductor integrated circuit chip 1. Power supply interconnects 13 and 14 run above the IO cells 11, i.e., on a flat periphery of an upper layer above the inner layer. The power supply interconnects 13 and 14 respectively supply a power supply potential VDD1 and a ground potential VSS1 to the IO cells 11. The IO cells 11 serves as buffers for impedance matching between the inside and outside of the semiconductor integrated circuit chip 1, and also as cells for connecting the external voltage applied to the electrode pads 10 to the power supply interconnects 13 and 14.

In a second linear region 15c and a third linear region 15d on the flat periphery of the inner layer of the semiconductor integrated circuit chip 1, a plurality of IO cells 11, connected to the electrode pads 10 arranged inwardly in five rows from the outer edge of the surface of the semiconductor integrated circuit chip 1 via interconnects 16, are arranged efficiently in the same orientation with no gap therebetween.

A linear circuit core placeable region 18 in which a circuit core can be placed is provided in at least part of a corner portion 15a and a first linear region 15b. The corner portion 15a is a square region each side of which is approximately the same as the longitudinal length of the IO cells 11. The size of the circuit core placeable region 18 is equivalent to 25 IO cells (or larger when the corner portion 15a is included). In the circuit core placeable region 18, various types of circuit cores such as a memory circuit, an electric fuse, an analog circuit, a CPU, a logic circuit, a power supply circuit, an electrostatic discharge (ESD) protection element, and a standard cell can be placed.

The semiconductor integrated circuit chip 1 can be laid out in the following manner. That is, a basic pattern is prepared, which includes five electrode pads 10 arranged in line from the outer edge of the surface of the semiconductor integrated circuit chip 1, five IO cells 11 arranged on the flat periphery of the inner layer, and interconnects 16 connecting the electrode pads 10 and the IO cells 11. Such basic patterns are arranged side by side along one side of the semiconductor integrated circuit chip 1 up to the end of the side, and the basic patterns changed in orientation are arranged side by side along an adjoining side. In the example shown in FIG. 1, the basic patterns are arranged side by side along the lower side from the left to right ends, and then the basic patterns rotated 90 degrees counterclockwise are arranged side by side along the right side from the bottom to top ends. With this arrangement, the wide circuit core placeable region 18 as shown in FIG. 1 is secured.

Figure 2:
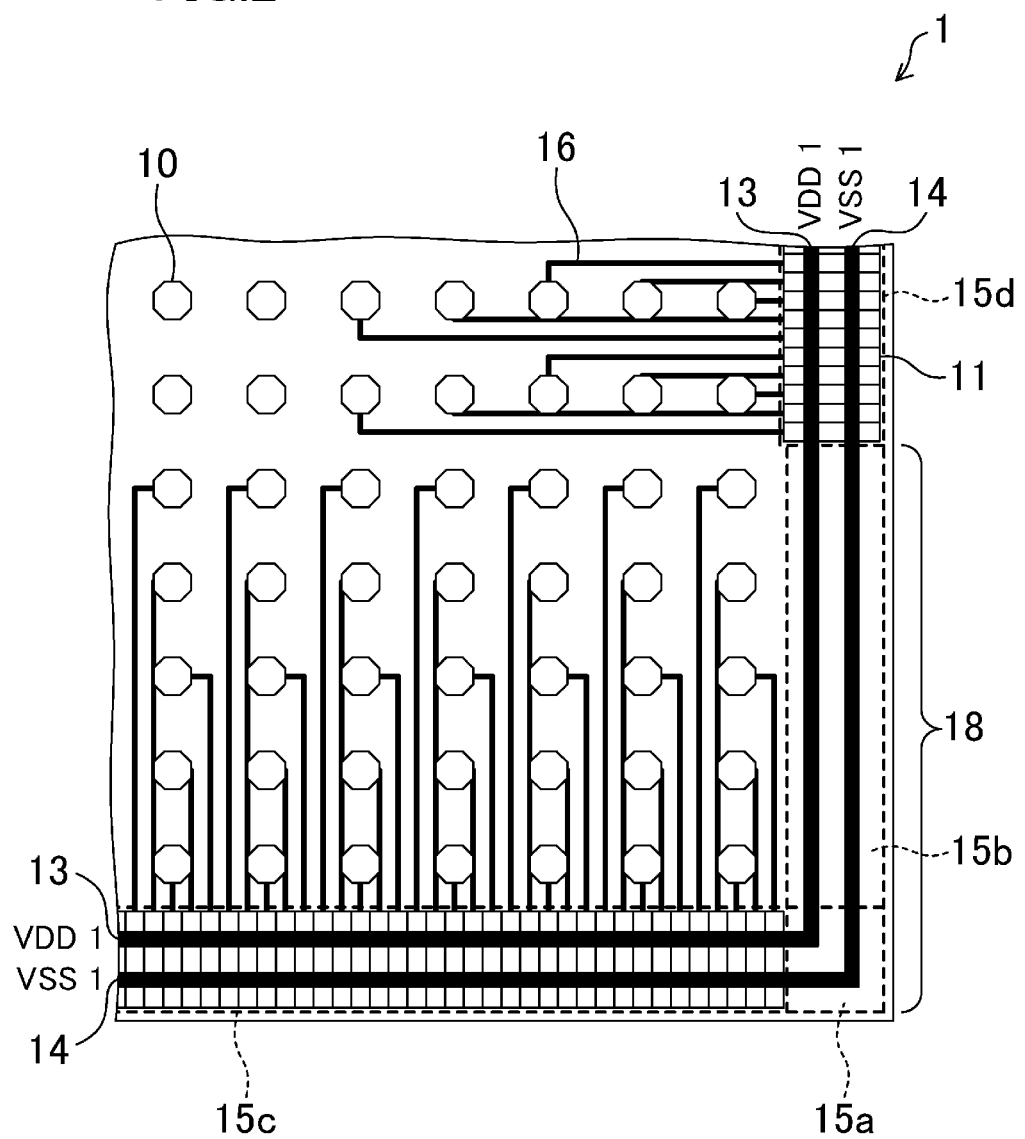
FIG. 2 is a layout plan of a semiconductor integrated circuit chip of a variation of the first embodiment.

The power supply interconnects 13 and 14 may not be partitioned, but continue running above the corner portion 15a and the first linear region 15b, to constitute ring power supply interconnects (see FIG. 2). With this placement, the IO power can be supplied directly to a circuit core placed in the circuit core placeable region 18, and this makes it possible to take countermeasures against a power voltage drop of the circuit core.

Figure 3:
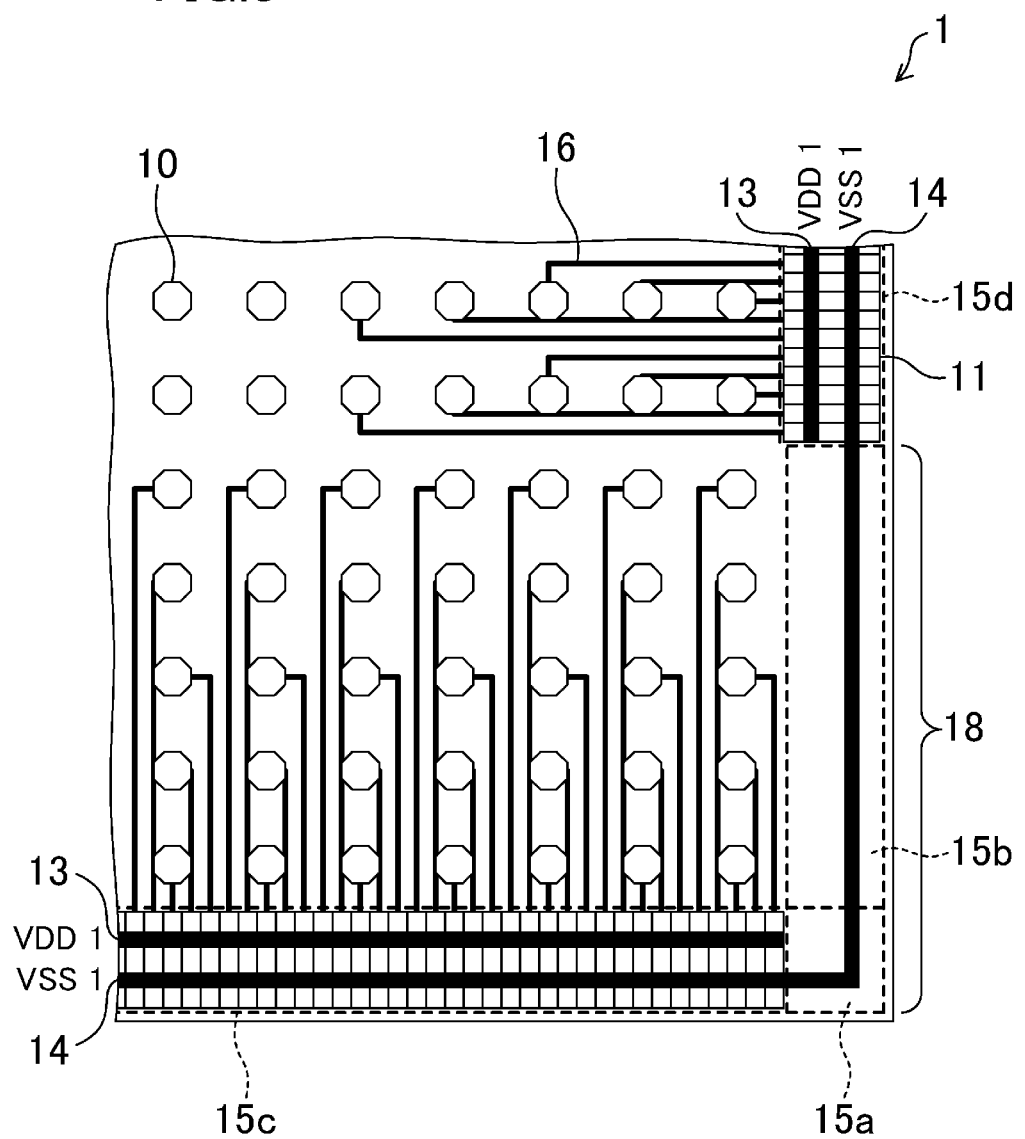
FIG. 3 is a layout plan of a semiconductor integrated circuit chip of another variation of the first embodiment.

Only the power supply interconnect 14 may constitute a ring power supply interconnect (see FIG. 3). With this placement, the ground power supply for a circuit core placed in the circuit core placeable region 18 can be intensified.

Figure 4:
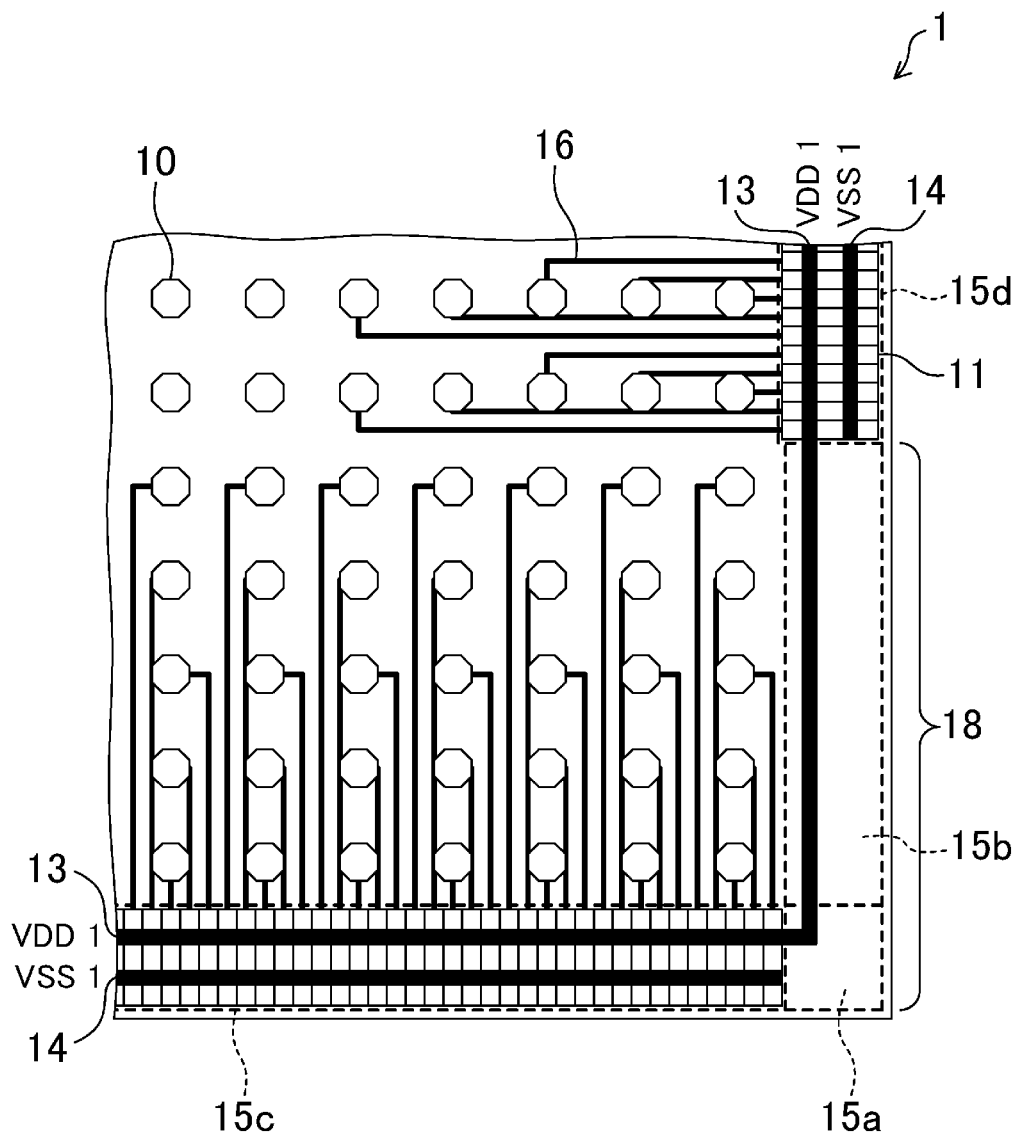
FIG. 4 is a layout plan of a semiconductor integrated circuit chip of yet another variation of the first embodiment.

Only the power supply interconnect 13 may constitute a ring power supply interconnect (see FIG. 4). Although the power supply for the IO cells 11 is sometimes different from the power supply voltage for the inside of the semiconductor integrated circuit chip 1, the power supply potential can be supplied to the IO cells 11 stably by providing the power supply interconnect 13 as a ring power supply interconnect.

Figure 5:
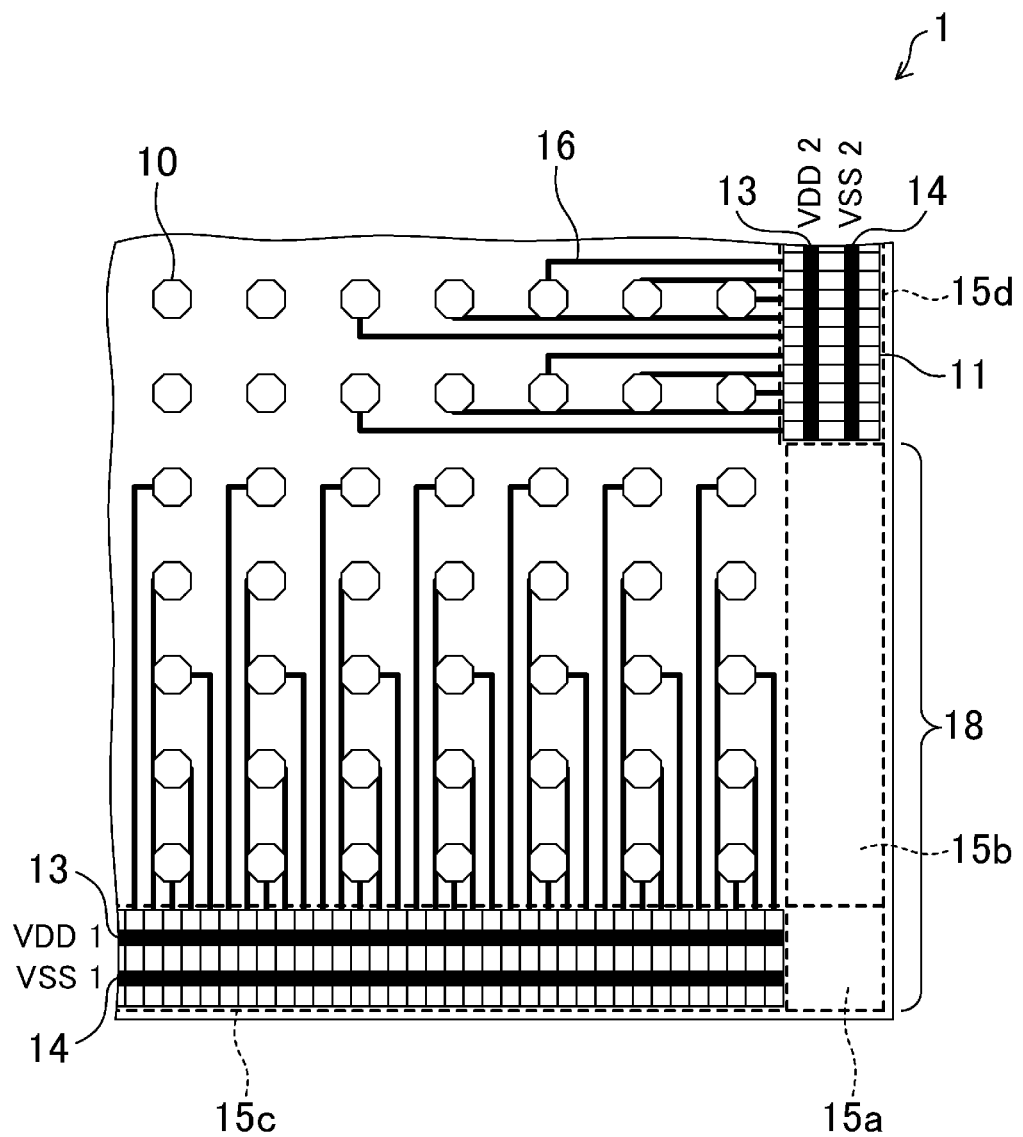
FIG. 5 is a layout plan of a semiconductor integrated circuit chip of yet another variation of the first embodiment.

Different potentials may be supplied to the second linear region 15c and the third linear region 15d separately (see FIG. 5). This makes it possible to arrange IO cells 11 operating with one power supply in the second linear region 15c while arranging IO cells 11 operating with another power supply in the third linear region 15d.

Note that, irrespective of the configuration of the power supply interconnects 13 and 14, power can be supplied to a circuit core placed in the circuit core placeable region 18 from any of the power supply interconnects 13 and 14 and an internal power supply section not shown.

Figure 6:
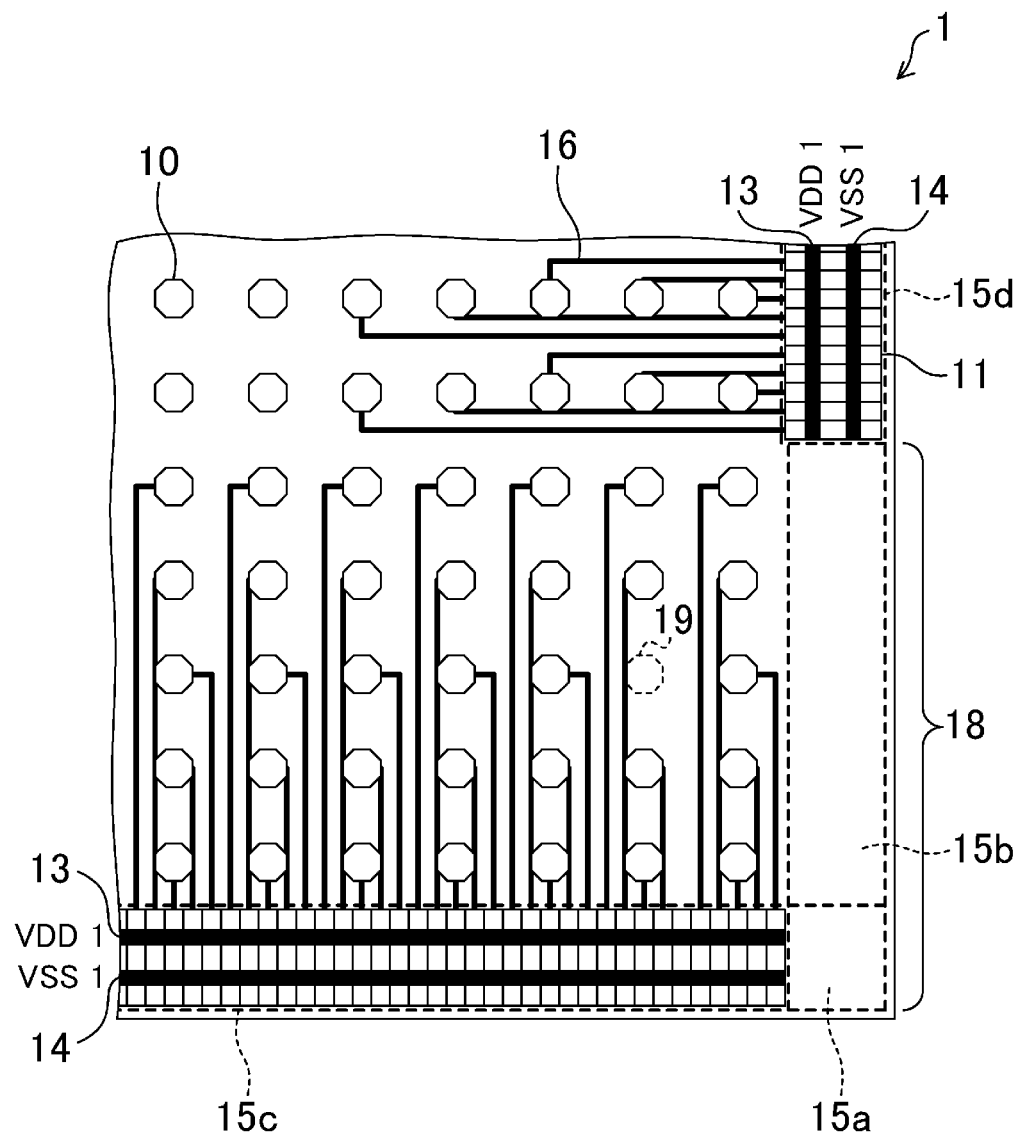
FIG. 6 is a layout plan of a semiconductor integrated circuit chip of yet another variation of the first embodiment.

Some of the electrode pads 10 may drop out as indicated by 19 in FIG. 6. By omitting some of the electrode pads 10, the congestion of the interconnects 16 can be relieved.

Figure 7:
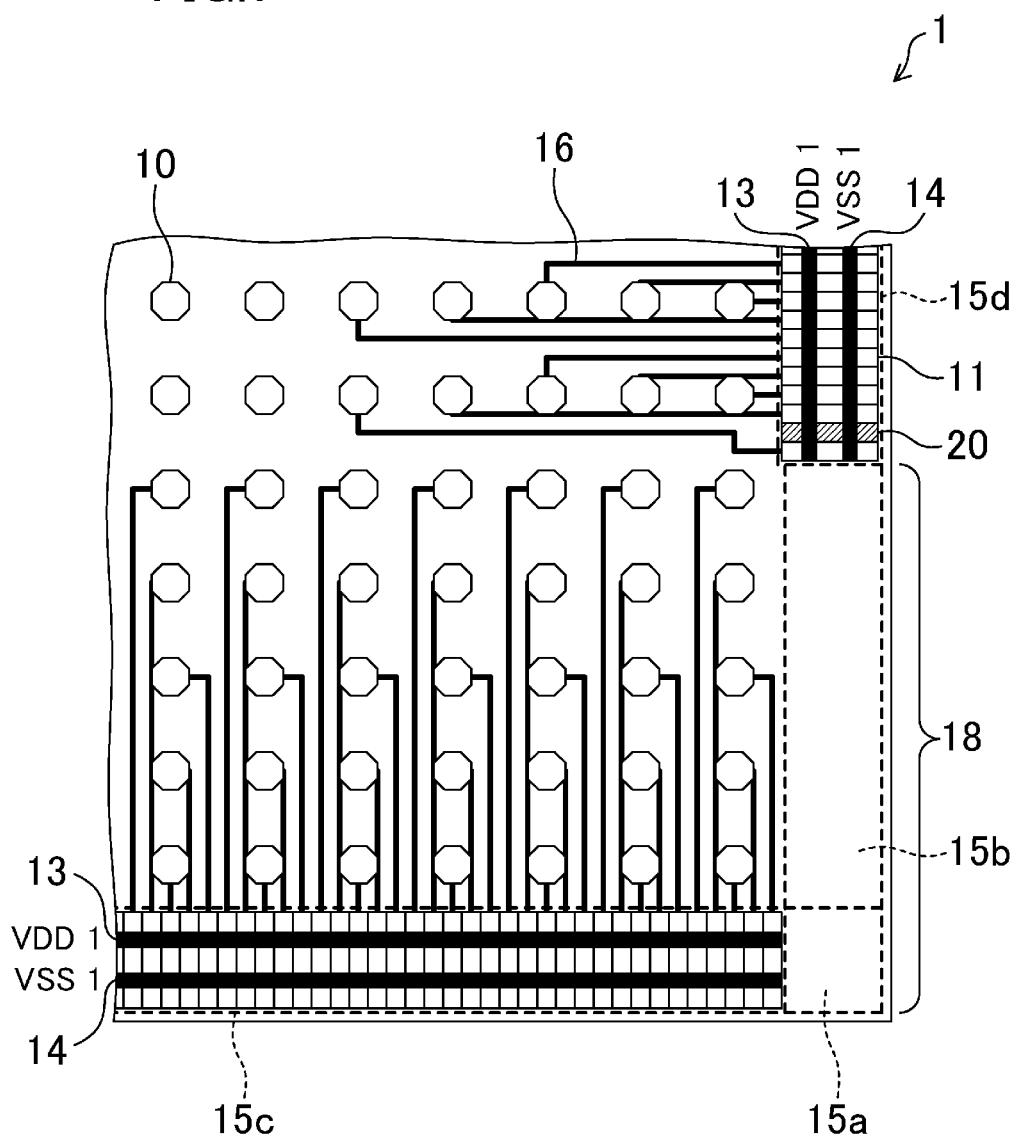
FIG. 7 is a layout plan of a semiconductor integrated circuit chip of yet another variation of the first embodiment.

As shown in FIG. 7, a filler cell 20, or a power protection cell 20, which is not connected to an electrode pad 10, may be provided between two IO cells 11. Having such a cell, the connection between the electrode pads 10 and the IO cells 11 becomes easy. Also, by shortening the interconnects 16, the electrical properties can be improved.

Figure 8:
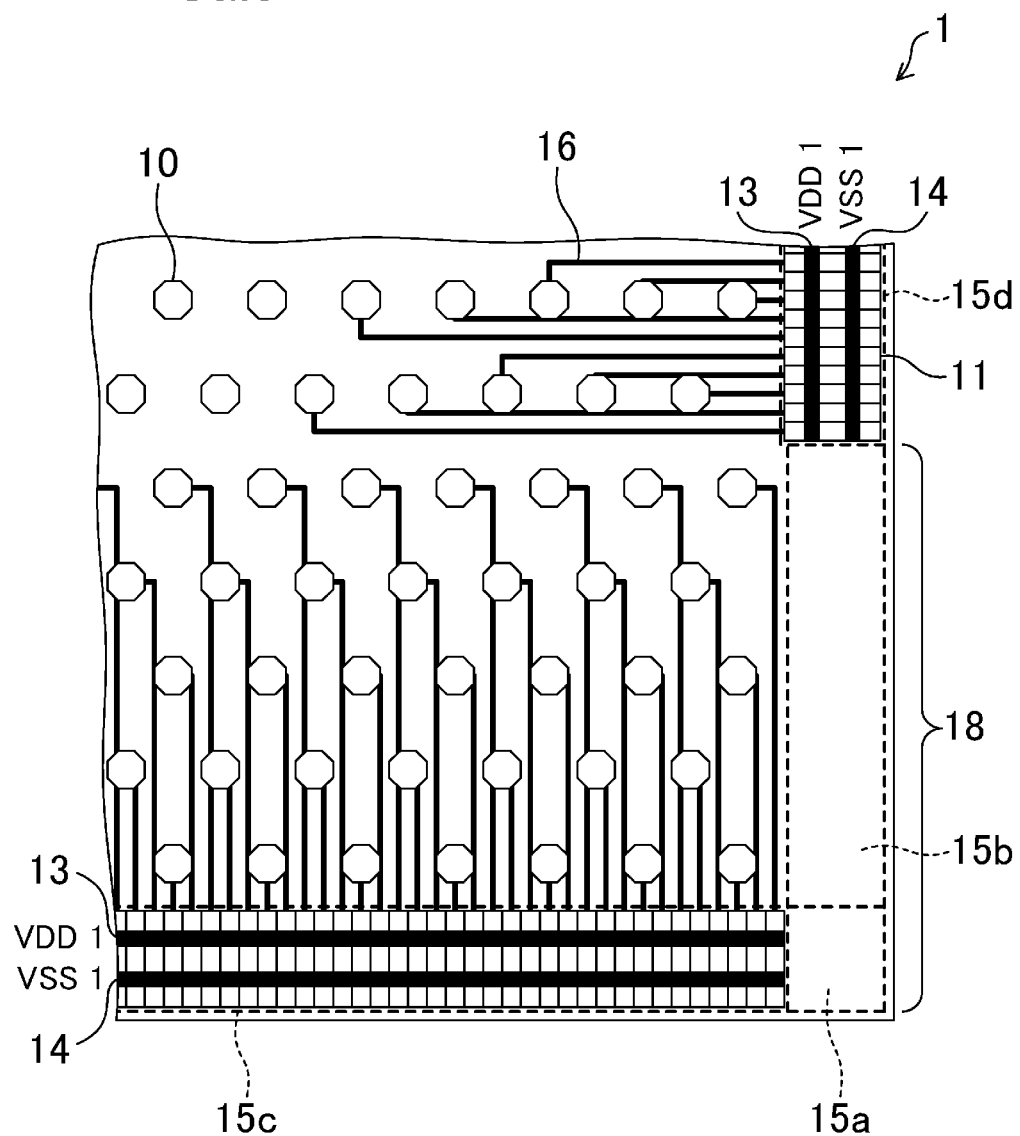
FIG. 8 is a layout plan of a semiconductor integrated circuit chip of yet another variation of the first embodiment.

The electrode pads 10 may not be arranged regularly, or, as shown in FIG. 8, may be arranged in a staggered shape as viewed from top. With this staggered arrangement of the electrode pads 10, the congestion of the interconnects 16 can be relieved.

Second Embodiment

Figure 9:
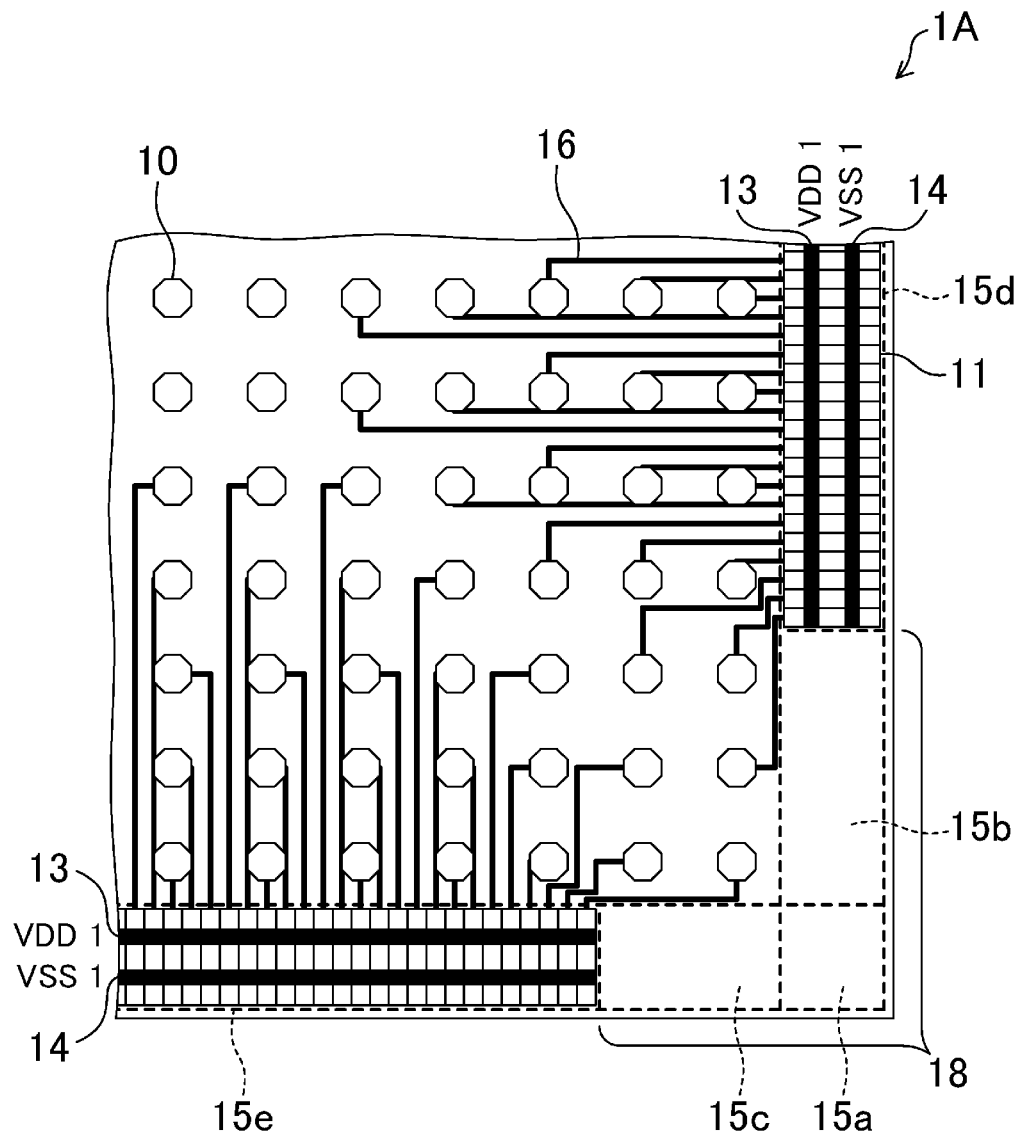
FIG. 9 is a layout plan of a semiconductor integrated circuit chip of the second embodiment.

FIG. 9 shows a layout of a semiconductor integrated circuit chip of the second embodiment. IO cells 11 are arranged tightly in a third linear region 15*d* and a fourth linear region 15*e* of a semiconductor integrated circuit chip 1A, and an L-shaped circuit core placeable region 18 having a size equivalent to a total of 25 IO cells 11 (or larger when a corner portion 15*a* is included), specifically 10 IO cells in a second linear region 15*c* and 15 IO cells in a first linear region 15*b*, is provided. With this formation of the circuit core placeable region 18 over the corner portion 15*a*, the first linear region 15*b*, and the second linear region 15*c*, the IO cells 11 can be arranged considering the state of the power supply for the IO cells 11, the easiness of placement of interconnects 16, the electrical properties related to the lengths of the interconnects 16, etc.

Figure 10:
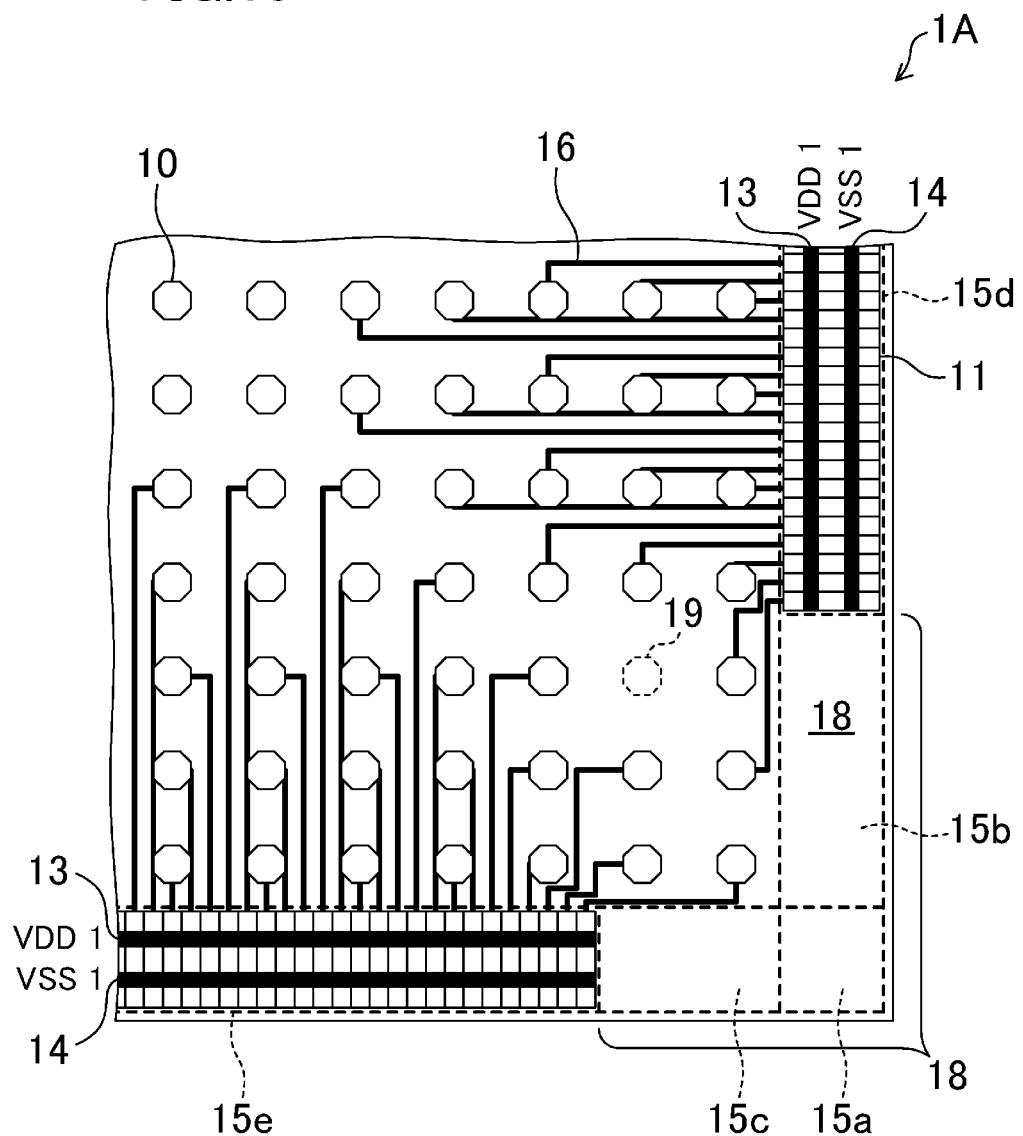
FIG. 10 is a layout plan of a semiconductor integrated circuit chip of a variation of the second embodiment.

Some of the electrode pads 10 may drop out as indicated by 19 in FIG. 10. By omitting some of the electrode pads 10, the congestion of the interconnects 16 can be relieved.

Figure 11:
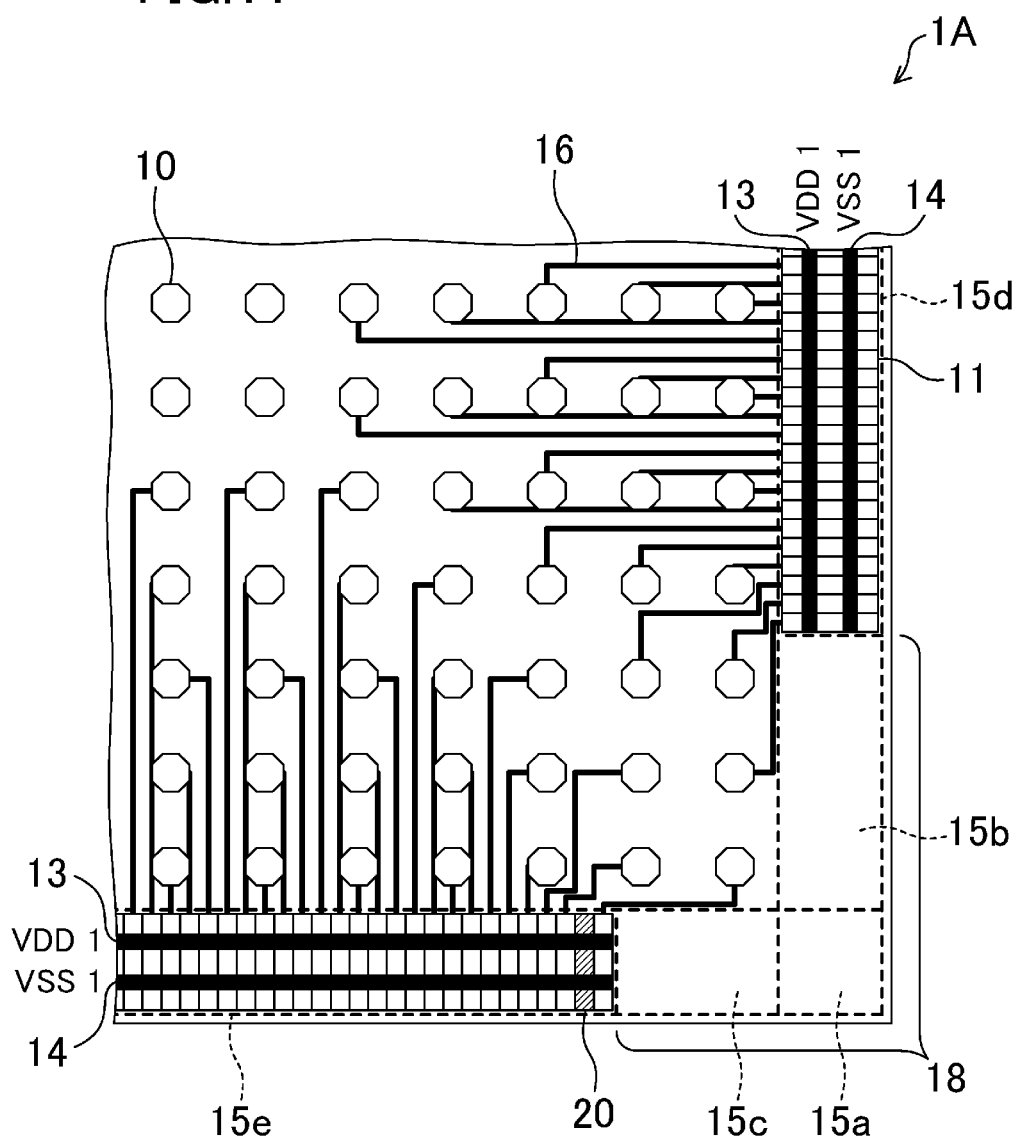
FIG. 11 is a layout plan of a semiconductor integrated circuit chip of another variation of the second embodiment.

As shown in FIG. 11, a filler cell 20, or a power protection cell 20, which is not connected to an electrode pad 10, may be provided between two IO cells 11. Having such a cell, the connection between the electrode pads 10 and the IO cells 11 becomes easy. Also, by shortening the interconnects 16, the electrical properties can be improved.

Figure 12:
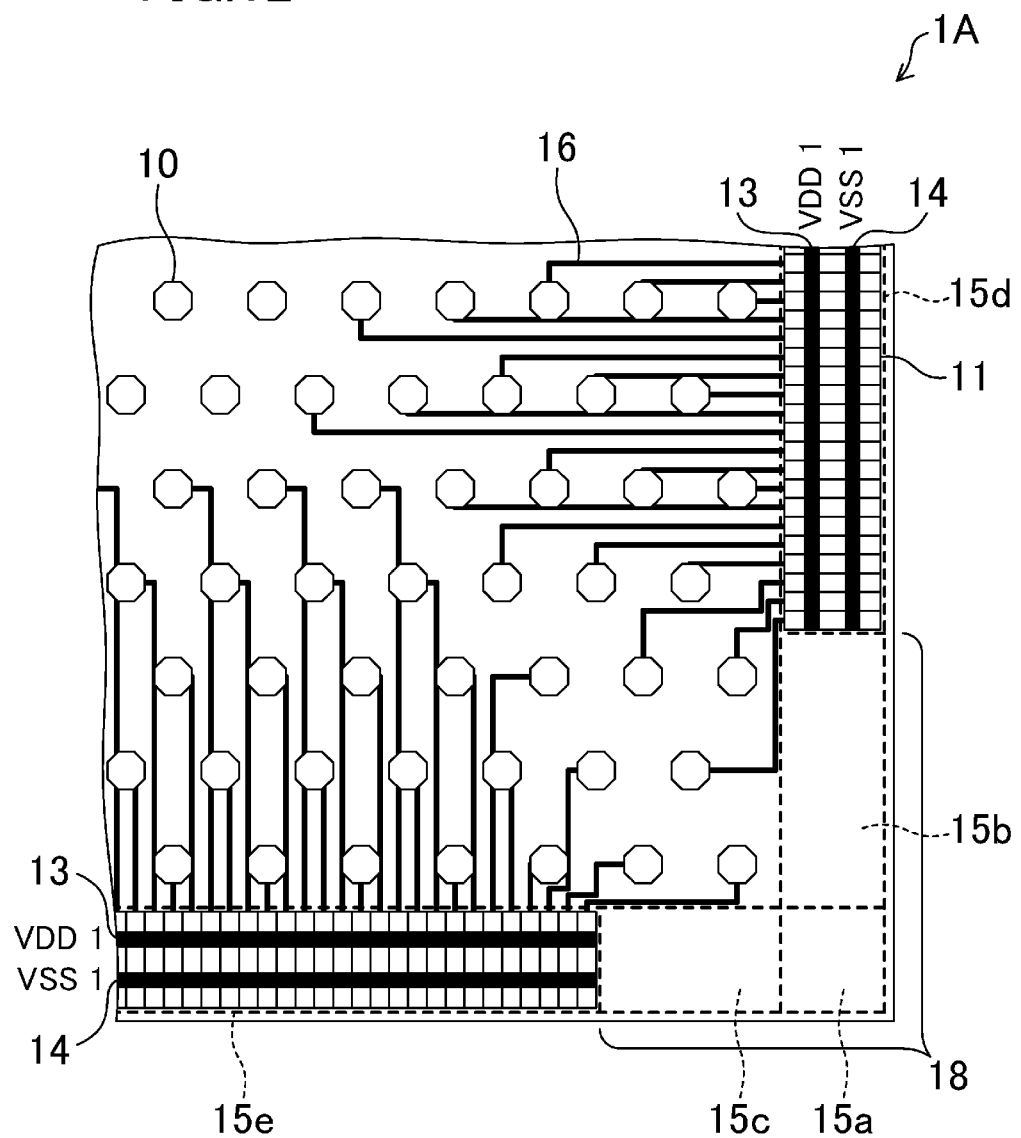
FIG. 12 is a layout plan of a semiconductor integrated circuit chip of yet another variation of the second embodiment.

The electrode pads 10 may not be arranged regularly, or, as shown in FIG. 12, may be arranged in a staggered shape as viewed from top. With this staggered arrangement of the electrode pads 10, the congestion of the interconnects 16 can be relieved.

Figure 13:
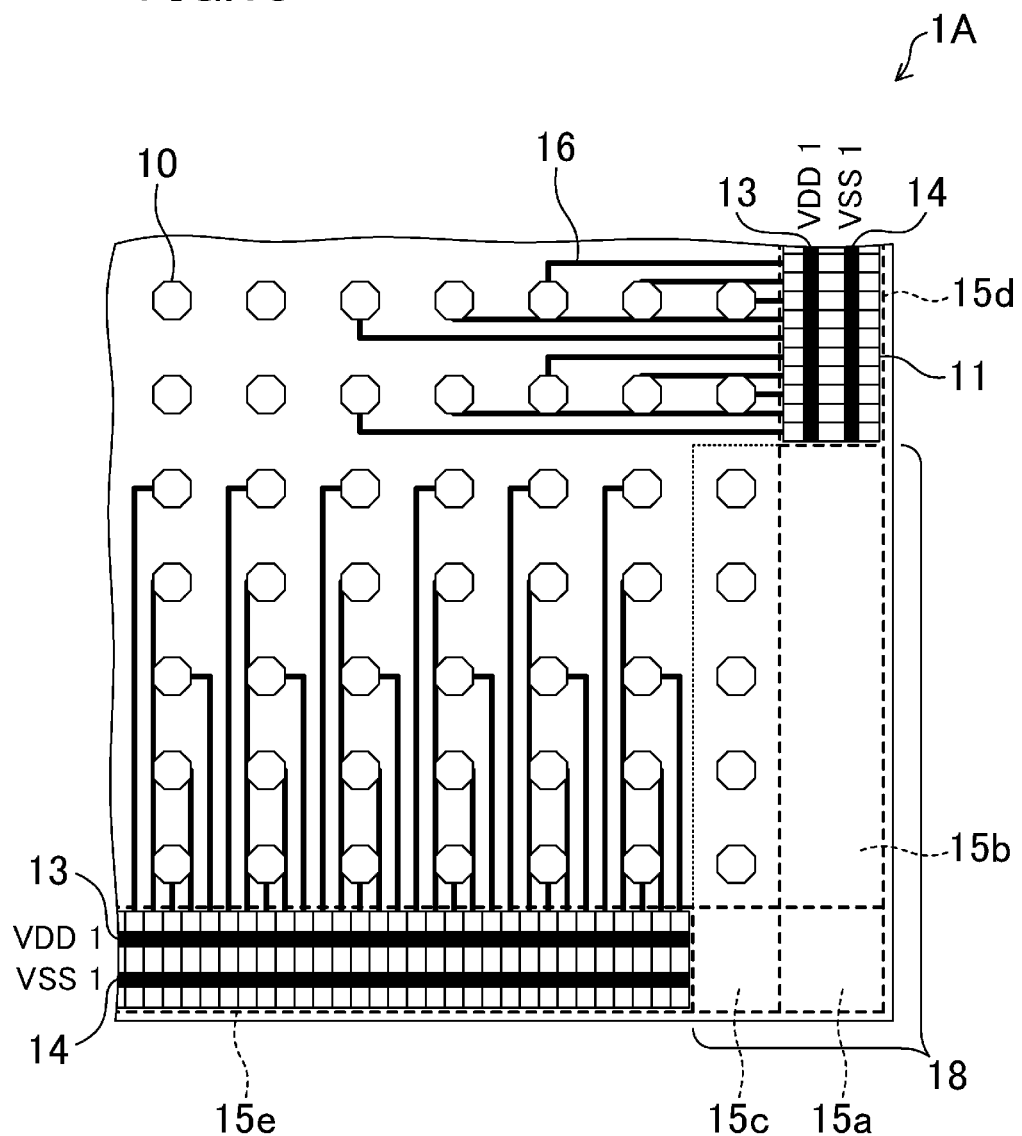
FIG. 13 is a layout plan of a semiconductor integrated circuit chip of yet another variation of the second embodiment.

As shown in FIG. 13, the circuit core placeable region 18 may be expanded to a region overlapping some electrode pads 10 as viewed from top. These electrode pads 10 are not connected to IO cells 11, but are connected directly to a circuit core placed in the circuit core placeable region 18. For example, the power supply and input/output signals for the circuit core are in direct connection with these electrode pads 10. With this configuration, when an analog circuit, etc. is placed as a circuit core, noise from the interconnects 16 and the power supply interconnects 13 and 14 can be avoided. Also, this configuration is advantageous for a circuit core that is large in area but small in the number of signals.

Figure 14:
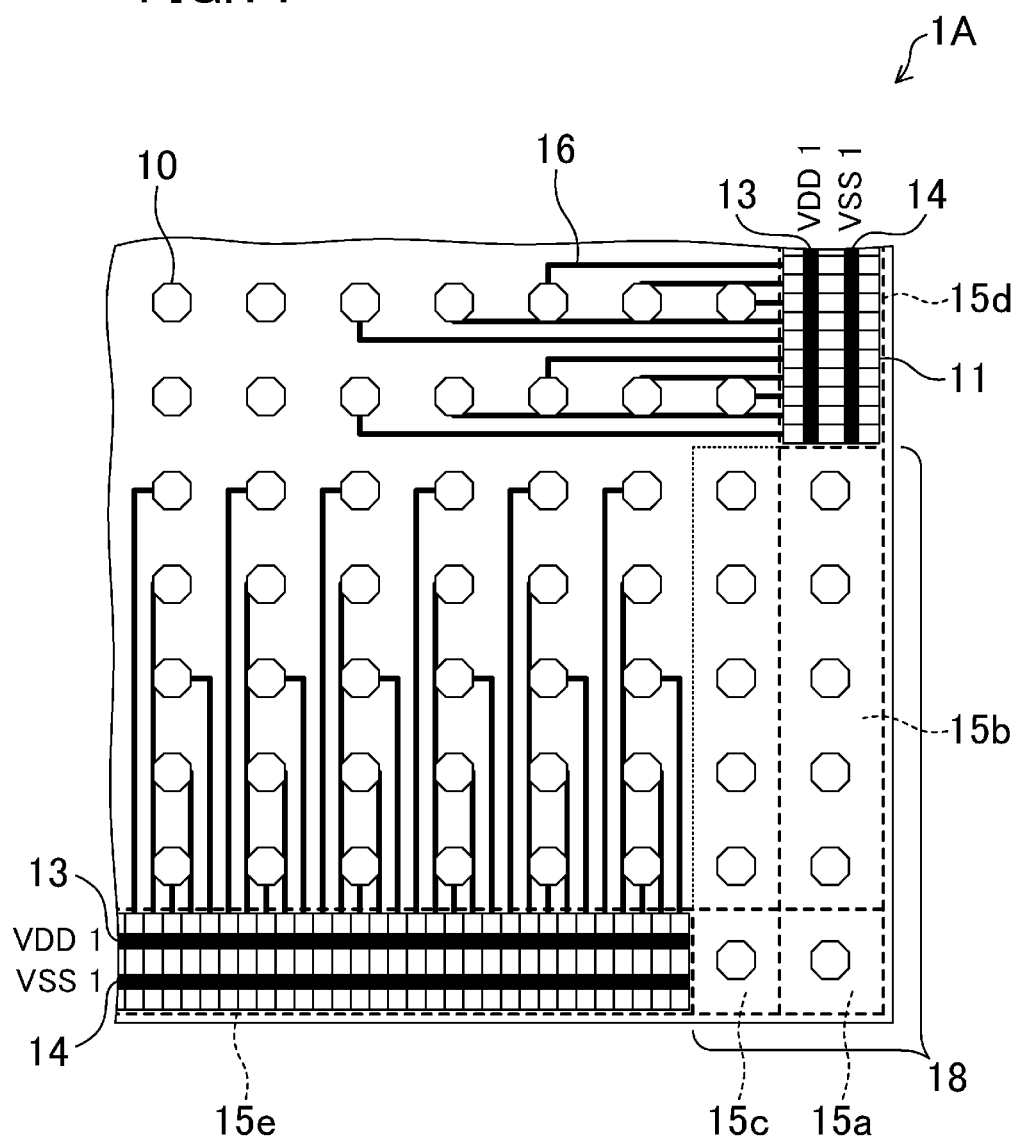
FIG. 14 is a layout plan of a semiconductor integrated circuit chip of yet another variation of the second embodiment.
Figure 15:
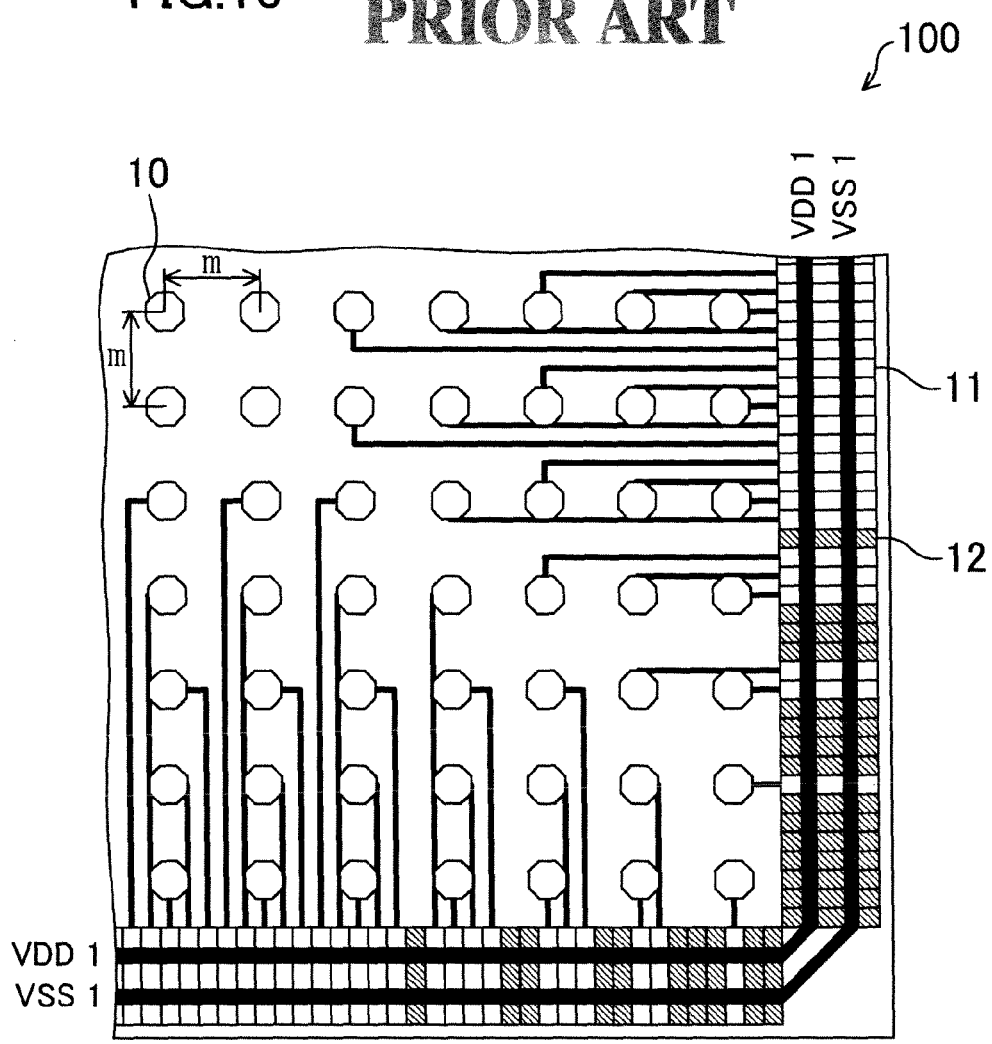
FIG. 15 is a layout plan of a conventional semiconductor integrated circuit chip.

As shown in FIG. 14, the number of electrode pads 10 arranged on a portion of the surface of the semiconductor integrated circuit chip 1A located above the circuit core placeable region 18 can be further increased. This makes it possible to intensify the power supply for a circuit core and increase the number of signals.

In the above embodiments, the electrode pads 10 arranged inwardly in five rows from the outer edge of the surface of the semiconductor integrated circuit chip 1 were connected to the IO cells 11. However, an effective circuit core placeable region 18 can be secured by arranging IO cells 11 in the manner described above when electrode pads 10 in three or more rows from the outer edge are connected to the IO cells 11.

The semiconductor integrated circuit chip of the present disclosure, in which a vacant region with no IO cell placed can be used as a circuit core placeable region, is useful in a system LSI, etc.

What is claimed is:

1. A semiconductor integrated circuit chip mounted on a substrate by flip chip bonding, comprising:
    a plurality of electrode pads arranged on a surface of the semiconductor integrated circuit chip;
    a corner portion of a flat periphery of an inner layer of the semiconductor integrated circuit chip;
    a first linear region adjoining one side of the corner portion;
    a second linear region adjoining another side of the corner portion; and
    a third linear region adjoining a side of the first linear region opposite to the side adjoining the corner portion,
    wherein a circuit core placeable region is provided in at least part of the corner portion and the first linear region,
    a plurality of IO cells respectively connected to the plurality of electrode pads are arranged in the second linear region and the third linear region, and
    the plurality of IO cells in the second linear region are respectively connected to the plurality of electrode pads arranged inwardly in n rows×n columns (n is an integer equal to or more than 3) from a corner of the semiconductor integrated circuit chip located above the corner portion.

2. The semiconductor integrated circuit chip of claim 1, wherein power supply interconnects for supplying a predetermined potential to the plurality of IO cells are placed on portions of a flat periphery of an upper layer above the inner layer located above the second linear region and the third linear region.

3. The semiconductor integrated circuit chip of claim 2, wherein
    the power supply interconnects are paired interconnects for supplying a power supply potential and a ground potential to the plurality of IO cells, and
    at least one of the paired interconnects is a ring power supply interconnect placed on the flat periphery of the upper layer above the inner layer.

4. The semiconductor integrated circuit chip of claim 3, wherein the ring power supply interconnect is an interconnect for supplying the power supply potential.

5. The semiconductor integrated circuit chip of claim 3, wherein the ring power supply interconnect is an interconnect for supplying the ground potential.

6. The semiconductor integrated circuit chip of claim 2, wherein the power supply interconnects are partitioned by a portion of the flat periphery of the upper layer above the inner layer located above the circuit core placeable region, and different potentials are supplied to the second linear region and the third linear region separately.

7. The semiconductor integrated circuit chip of claim 1, wherein a memory circuit is placed in the circuit core placeable region.

8. The semiconductor integrated circuit chip of claim 1, wherein an electric fuse is placed in the circuit core placeable region.

9. The semiconductor integrated circuit chip of claim 1, wherein an analog circuit is placed in the circuit core placeable region.

10. The semiconductor integrated circuit chip of claim 1, wherein an electrode pad connected to no IO cell is arranged on a portion of the surface of the semiconductor integrated circuit chip located above the circuit core placeable region.

11. The semiconductor integrated circuit chip of claim 1, wherein the plurality of electrode pads are arranged in a grid shape as viewed from top.

12. The semiconductor integrated circuit chip of claim 1, wherein the plurality of electrode pads are arranged in a staggered shape as viewed from top.

13. The semiconductor integrated circuit chip of claim 1, wherein a filler cell is provided between two of the plurality of IO cells.

14. The semiconductor integrated circuit chip of claim 1, wherein a power protection cell is provided between two of the plurality of IO cells.

* * * * *